US012585847B2

(12) United States Patent　　　　(10) Patent No.:　US 12,585,847 B2

Pedersen　　　　　　　　　　　　　(45) Date of Patent:　Mar. 24, 2026

(54) SIMULATIONS FOR EVALUATING DRIVING BEHAVIORS OF AUTONOMOUS VEHICLES

(71) Applicant: WAYMO LLC, Mountain View, CA (US)

(72) Inventor: Jonathan Lee Pedersen, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 676 days.

(21) Appl. No.: 17/132,863

(22) Filed: Dec. 23, 2020

(65) Prior Publication Data

US 2022/0198107 A1　　Jun. 23, 2022

(51) Int. Cl.
| *G06F 30/27* | (2020.01) |
| *B60W 30/06* | (2006.01) |
| *B60W 30/095* | (2012.01) |
| *B60W 30/12* | (2020.01) |
| *G05D 1/00* | (2024.01) |

(52) U.S. Cl.
CPC ............. *G06F 30/27* (2020.01); *B60W 30/06* (2013.01); *B60W 30/0953* (2013.01); *B60W 30/12* (2013.01); *G05D 1/0088* (2013.01)

(58) Field of Classification Search
None
See application file for complete search history.

(56) References Cited

U.S. PATENT DOCUMENTS

| 8,744,648 | B2 | 6/2014 | Anderson et al. |
| 8,788,134 | B1 | 7/2014 | Litkouhi et al. |
| 9,836,895 | B1 | 12/2017 | Nygaard et al. |
| 9,868,446 | B1 | 1/2018 | Zhu et al. |
| 10,002,471 | B2 | 6/2018 | Blayvas et al. |
| 10,397,019 | B2 | 8/2019 | Hartung et al. |
| 10,599,546 | B1 * | 3/2020 | Walther ............. G06F 11/3457 |
| 10,635,761 | B2 | 4/2020 | English et al. |
| 11,150,660 | B1 * | 10/2021 | Kabirzadeh ............ G06F 30/15 |
| 11,257,390 | B2 | 2/2022 | Wickman et al. |
| 11,403,949 | B2 * | 8/2022 | Imanishi ............... B60W 50/14 |
| 11,415,997 | B1 * | 8/2022 | Dolan ................. G06F 11/3688 |
| 11,574,089 | B2 * | 2/2023 | O'Malley .............. G06F 30/20 |

(Continued)

FOREIGN PATENT DOCUMENTS

EP　　　　　3722907 A1 * 10/2020　.......... G05D 1/0212

*Primary Examiner* — Akash Saxena

(74) *Attorney, Agent, or Firm* — Botos Churchill IP Law

(57) ABSTRACT

Evaluating a simulation of an autonomous vehicle may be performed by using one or more processors to receive log data collected for a given area, generate environment data for the given area using the log data, run the set of simulations using an autonomous vehicle software, extract one or more metrics from the set of simulations, and evaluate the set of simulations using the one or more metrics. The set of simulations includes one or more of a selection simulation comprising a selection of a location related to the particular maneuver in the given area, a decision process simulation comprising a decision process playthrough for the particular maneuver in the given area, a maneuver simulation comprising a maneuver playthrough of the particular maneuver in the given area, and a replay simulation comprising a replay of the particular maneuver in a run from the log data.

20 Claims, 10 Drawing Sheets

(56) References Cited

U.S. PATENT DOCUMENTS

| | | | | |
|---|---|---|---|---|
| 11,577,741 | B1 * | 2/2023 | Reschka | B60W 30/0953 |
| 11,724,742 | B2 * | 8/2023 | Feijoo | G06V 20/56 |
| | | | | 701/41 |
| 11,782,451 | B1 * | 10/2023 | Venkatraman | B60W 60/001 |
| | | | | 701/26 |
| 11,851,086 | B2 * | 12/2023 | Cohen | G01C 21/3453 |
| 11,921,504 | B1 * | 3/2024 | Chu | B60W 50/04 |
| 12,024,197 | B2 * | 7/2024 | Fairley | B60W 60/0011 |
| 12,027,053 | B1 * | 7/2024 | Crossman | B60W 30/0956 |
| 2009/0039884 | A1 | 2/2009 | Schiano | |
| 2016/0210383 | A1 | 7/2016 | Alaniz et al. | |
| 2017/0351256 | A1 * | 12/2017 | Kumakiri | B60W 60/0053 |
| 2018/0292824 | A1 * | 10/2018 | Kazemi | B60W 30/00 |
| 2019/0303759 | A1 | 10/2019 | Farabet et al. | |
| 2019/0342425 | A1 | 11/2019 | Cheng et al. | |
| 2019/0369626 | A1 * | 12/2019 | Lui | G05D 1/0221 |
| 2020/0042656 | A1 | 2/2020 | Zapolsky et al. | |
| 2020/0357282 | A1 * | 11/2020 | Imanishi | G08G 1/166 |
| 2020/0380773 | A1 * | 12/2020 | Gundling | G07C 5/0808 |
| 2020/0410062 | A1 * | 12/2020 | O'Malley | B60W 60/001 |
| 2020/0410063 | A1 * | 12/2020 | O'Malley | G06F 30/20 |
| 2021/0053567 | A1 * | 2/2021 | Dyer | G05D 1/0088 |
| 2021/0086795 | A1 * | 3/2021 | Zhao | G05D 1/0088 |
| 2021/0133466 | A1 * | 5/2021 | Gier | G05D 1/0223 |
| 2021/0197819 | A1 * | 7/2021 | Okamoto | B60W 40/04 |
| 2021/0229678 | A1 * | 7/2021 | Wang | B60W 40/105 |
| 2021/0237769 | A1 * | 8/2021 | Ostafew | B60W 30/18159 |
| 2021/0245786 | A1 * | 8/2021 | Ma | B60W 30/18163 |
| 2021/0271241 | A1 * | 9/2021 | Haggblade | G06V 10/82 |
| 2021/0370972 | A1 * | 12/2021 | Bagschik | G06F 30/27 |
| 2021/0374423 | A1 | 12/2021 | Iyengar | |
| 2021/0394787 | A1 * | 12/2021 | Xiao | B60W 60/0011 |
| 2021/0403032 | A1 * | 12/2021 | Jing | G05D 1/0022 |
| 2021/0403033 | A1 * | 12/2021 | Cohen | G01C 21/3453 |
| 2022/0024467 | A1 * | 1/2022 | Desies | B60W 50/0097 |
| 2022/0035972 | A1 * | 2/2022 | Gamble, Jr. | G01S 19/393 |
| 2022/0036579 | A1 | 2/2022 | Liang et al. | |
| 2022/0057794 | A1 * | 2/2022 | Patel | G05D 1/0038 |
| 2022/0099450 | A1 * | 3/2022 | Pandit | G08G 1/0112 |
| 2022/0194436 | A1 | 6/2022 | Goeddel et al. | |
| 2022/0198107 | A1 * | 6/2022 | Pedersen | G06F 30/27 |
| 2022/0204009 | A1 * | 6/2022 | Choi | G06F 11/3696 |
| 2022/0269836 | A1 * | 8/2022 | Mukundan | B60W 60/00276 |
| 2022/0297725 | A1 * | 9/2022 | Zwiener | B60W 60/00256 |
| 2022/0326711 | A1 * | 10/2022 | Gutlansky | G06V 10/25 |
| 2023/0033518 | A1 * | 2/2023 | Matlack | G05D 1/0212 |
| 2023/0079202 | A1 * | 3/2023 | You | B60W 40/105 |
| | | | | 701/25 |
| 2023/0331247 | A1 | 10/2023 | Wurmsdobler et al. | |
| 2023/0382400 | A1 * | 11/2023 | Wang | B60W 40/09 |
| 2024/0169111 | A1 * | 5/2024 | Gribble | G06F 30/20 |
| 2024/0286626 | A1 | 8/2024 | Calleija et al. | |

* cited by examiner

100

200

400

600

800

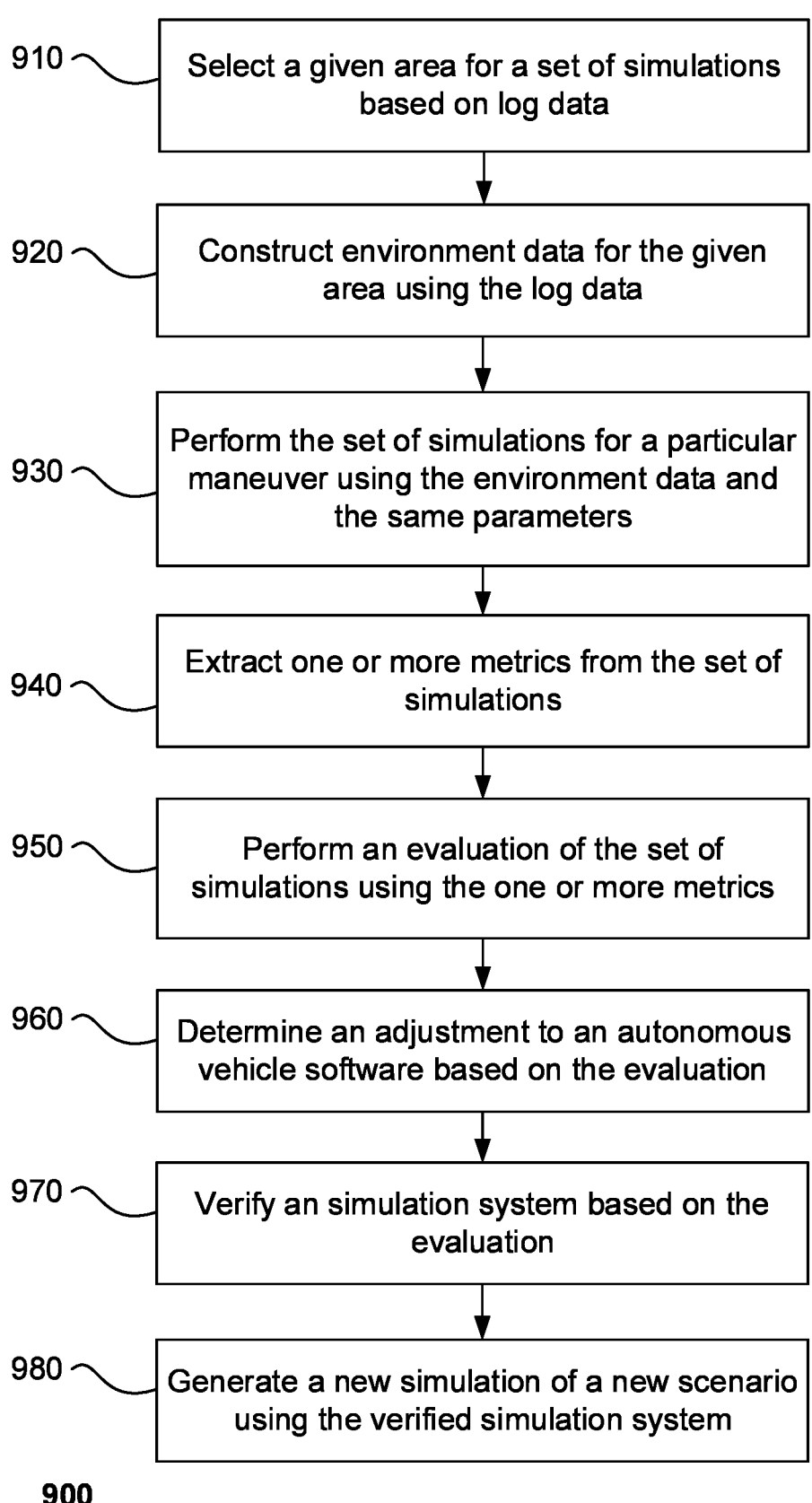

910   Select a given area for a set of simulations based on log data

920   Construct environment data for the given area using the log data

930   Perform the set of simulations for a particular maneuver using the environment data and the same parameters 940   Extract one or more metrics from the set of simulations 950   Perform an evaluation of the set of simulations using the one or more metrics 960   Determine an adjustment to an autonomous vehicle software based on the evaluation 970   Verify an simulation system based on the evaluation 980   Generate a new simulation of a new scenario using the verified simulation system

SIMULATIONS FOR EVALUATING DRIVING BEHAVIORS OF AUTONOMOUS VEHICLES

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. It is critical that the autonomous control software used by these vehicles to operate in the autonomous mode is tested and validated before such software is actually used to control the vehicles in areas where the vehicles are interacting with other objects.

BRIEF SUMMARY

Aspects of the disclosure provide for a method for evaluating sensor behavior in an autonomous vehicle. The method includes receiving, by one or more processors, log data collected for a given area; generating, by the one or more processors, environment data for the given area using the log data; running, by the one or more processors using a software of the autonomous vehicle, a set of simulations for a particular maneuver that includes a combination of at least two of (i) a decision instances simulation comprising a selection of a location related to the particular maneuver in the given area, (ii) a decision process simulation comprising a decision process playthrough for the particular maneuver in the given area, (iii) a novel maneuver simulation comprising a maneuver playthrough of the particular maneuver in the given area, and (iv) a replay simulation comprising a replay of the particular maneuver in a run from the log data; extracting, by the one or more processors, one or more metrics from the set of simulations; and evaluating, by the one or more processors, the set of simulations using the one or more metrics.

In one example, the method also includes determining, by the one or more processors, an adjustment to the software of the autonomous vehicle based on the evaluation to cause the software to improve the particular maneuver. In another example, the given area includes a point at which the particular maneuver appears in the log data. In a further example, the log data does not include data for the particular maneuver in the given area. In yet another example, generating the environment data for the given area using the log data includes reconstructing objects in the given area to represent real-world characteristics of the objects. In a still further example, the method also includes selecting, by the one or more processors, the given area based on feature criteria of the given area. In another example, the method also includes selecting, by the one or more processors, the given area based on user input. In a further example, the one or more metrics includes compliance metrics, location metrics, scene impact metrics, overall quality metrics, and improvement cost metrics. In yet another example, evaluating the set of simulations using the one or more metrics includes comparing the decision process simulation and the decision instances simulation; comparing the novel maneuver simulation and the replay simulation; and comparing the decision process simulation and the replay simulation.

Other aspects of the disclosure provide for a simulation system for an autonomous vehicle software. The simulation system includes one or more processors configured to receive log data collected for a given area; generate environment data for the given area using the log data; run, using the autonomous vehicle software, a set of simulations for a particular maneuver that includes (i) a decision instances simulation comprising a selection of a location related to the particular maneuver in the given area, (ii) a decision process simulation comprising a decision process playthrough for the particular maneuver in the given area, (iii) a novel maneuver simulation comprising a maneuver playthrough of the particular maneuver in the given area, and (iv) a replay simulation comprising a replay of the particular maneuver in a run from the log data; extract one or more metrics from the set of simulations; and evaluate the set of simulations using the one or more metrics.

In one example, the one or more processors are further configured to determine an adjustment to the software of the autonomous vehicle based on the evaluation to cause the software to improve the particular maneuver. In another example, the given area includes a point at which the particular maneuver appears in the log data. In a further example, the log data does not include data for the particular maneuver in the given area. In yet another example, the environment data for the given area using the log data is generated as reconstructions of real-world objects based on characteristics of the real-world objects.

In a still further example, the one or more processors are also configured to select the given area based on feature criteria of the given area. In another example, the one or more processors are also configured to select the given area based on user input. In a further example, the one or more metrics includes compliance metrics, location metrics, scene impact metrics, overall quality metrics, and improvement cost metrics. In yet another example, the evaluation of the set of simulations includes a comparison of the decision process simulation and the decision instances simulation; a comparison of the novel maneuver simulation and the replay simulation; and a comparison of the decision process simulation and the replay simulation.

Further aspects of the disclosure provide for a non-transitory, tangible computer-readable medium on which computer-readable instructions of a program are stored. The instructions, when executed by one or more computing devices, cause the one or more computing devices to perform a method for implementing running a simulation system for an autonomous vehicle. The method includes receiving log data collected for a given area; generating environment data for the given area using the log data; running, using a software of the autonomous vehicle, a set of simulations for a particular maneuver that includes a combination of at least two of (i) a decision instances simulation comprising a selection of a location related to the particular maneuver in the given area, (ii) a decision process simulation comprising a decision process playthrough for the particular maneuver in the given area, (iii) a novel maneuver simulation comprising a maneuver playthrough of the particular maneuver in the given area, and (iv) a replay simulation comprising a replay of the particular maneuver in a run from the log data; extracting one or more metrics from the set of simulations; and evaluating the set of simulations using the one or more metrics.

In one example, the one or more metrics includes compliance metrics, location metrics, scene impact metrics, overall quality metrics, and improvement cost metrics. In this example, evaluating the set of simulations using the one or more metrics includes comparing the decision process simulation and the decision instances simulation; comparing the novel maneuver simulation and the replay simulation; and comparing the decision process simulation and the replay simulation.

BRIEF DESCRIPTION OF THE DRAWINGS

FIG. 9 is a flow diagram of another example method in accordance with aspects of the disclosure.

DETAILED DESCRIPTION

Overview

Figure 1:
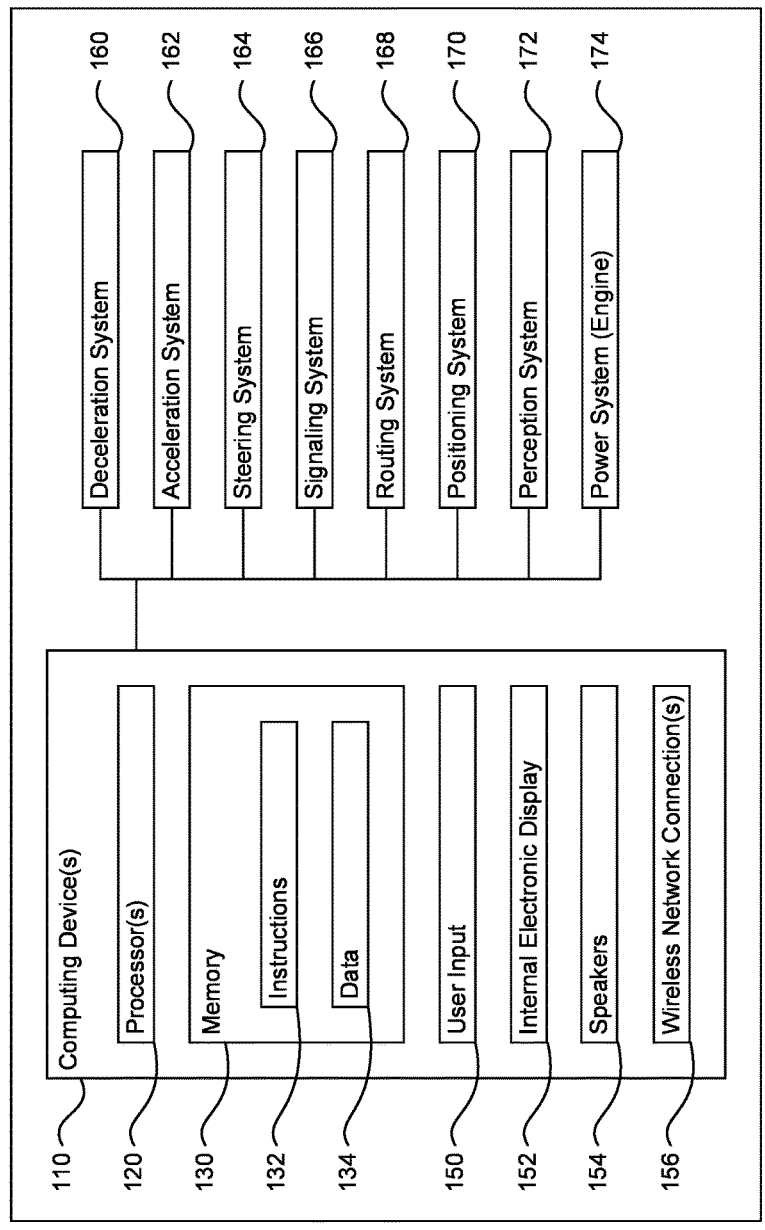
FIG. 1 is a functional diagram of an example vehicle in accordance with aspects of the disclosure.

The technology relates to using simulations to explore and evaluate new driving behavior of an autonomous vehicle in a new scenario. The simulations may include environments based on logs collected from vehicles driven through an area. Scenarios may be run in the simulation using autonomous vehicle software where the scenario is different from the runs in the logs or the software is different from what is used to collect the logs. Data collected in these scenarios may be used to evaluate the behavior of the autonomous vehicle software. From the evaluation, areas of improvement may be identified and changes may be made to improve the autonomous vehicle software.

A given area may be selected for a set of simulations based on log data. Selecting the given area may include selecting a point in time or a specific location in the given area related to where the set of simulations would start. In some implementations, the given area may be selected to include a particular maneuver. The log data may include data that was collected from one or more systems mounted on or in a vehicle driven along a path through the given area. The vehicle may or may not be driving autonomously through the given area. The log data may include characteristics of features detected in the vehicle's environment while the vehicle drives along the path, such as road agents, objects, traffic control features, or road features. The given area may be selected based on feature criteria of the given area, such as a particular type of object or a particular type of road feature in the given area.

The simulation system may construct environment data for the given area using the log data. The environment data includes input features or signals for the vehicle's computing devices running the software, such as reconstructions of objects in the given area that may be detected by the vehicle's perception system. The reconstructions of objects may represent the objects as closely as possible to the real-world objects. For the given area, data from the log data related to features in the vehicle's environment may be retrieved by the simulation system for an environment reconstruction of the given area. The retrieved log data may include data related to characteristics of static scenery and perception objects in the given area. The retrieved data may also include data collected on a different day, data collected by different vehicles or devices, or map data.

Parameters may be set for a set of simulations, including a particular maneuver and a start time. For example, the particular maneuver may be a pullover maneuver where a simulated vehicle's computing devices determines a location along a side of the road to pullover and stop. Other maneuvers may be, for example, lane changes or merges. The start time may correspond to a point in time or a point on the road in the simulation where the simulated vehicle's computing devices start to perform the particular maneuver. The parameters may be related to a particular run driven by a vehicle in the log data. In other examples, the parameters may differ from the runs in the log data. In particular, the start time for the particular maneuver may different from the runs in the log data to result in a different decision made by the simulated vehicle's computing devices than the logged decision in the log data.

The simulation system may run the set of simulations according to the parameters. In some simulations, a destination may be set in the given area, and the autonomous vehicle software may be run to navigate a simulated autonomous vehicle to perform the maneuver as it approaches the destination. Portions of a logged run may be used in the simulation. The set of simulations includes one or more of (i) a decision points related to instances in the particular maneuver in the given area, such as turning point or an end point, (ii) decision process playthrough for the particular maneuver using the autonomous vehicle software to see how the process occurs at each point along a the vehicle's route, (iii) maneuver playthrough to see how the particular maneuver interacts with agents and objects in the environment, and (iv) replay of the particular maneuver in a run from log data.

The simulation system or a separate system may extract one or more metrics from the set of simulations. For each simulation in the set of simulations, the same one or more metrics may be extracted. The one or more metrics may include compliance metrics (e.g., an amount of overlap with a driveway or no parking zone), location metrics (e.g., distance or angle to the curb if we are picking up a passenger), scene impact metrics (e.g., degree to which other road agents were delayed or otherwise inconvenienced), overall quality metric (i.e., a weighted combination of the other metrics), or improvement cost metrics (i.e., costs or cost differences of a better known location for the particular maneuver).

The simulation system may evaluate the set of simulations using the one or more metrics. The evaluation may include determining where bad maneuvers happened and why bad maneuvers happened. Comparisons between different pairs of simulations may reveal different insights about the autonomous vehicle software.

An adjustment to the software may be determined based on the evaluation to cause the software to operate the autonomous vehicle to avoid making bad maneuvers. For example, the adjustment may include altering a parameter that was determined to be a cause of the bad maneuver. In some implementations, the adjustment to the software may be made using a machine learning system, such as a machine learning system that uses a model to test and select parameters that increase the likelihood that the simulated autonomous vehicle makes good maneuvers.

In addition, using the comparisons of the replay simulation to any other types of simulation in the evaluations as described above, the simulation system may be verified to generate realistic autonomous vehicle behavior. Once verified, the simulation system may be used to generate simulations of autonomous vehicle behavior in new scenarios. The new scenarios may be in different areas or times than what exists in log data. Additionally, the new scenarios may be in an area not yet reached by an autonomous vehicle fleet or otherwise tested, such as for an area where there is a planned launch of an autonomous vehicle fleet. The verified simulation system may therefore be used to test autonomous vehicle behavior in completely new situations before ever launching an autonomous vehicle in that kind of situation. The verified simulation system may also be used to generate a large data set from which patterns of autonomous vehicle behavior may be extracted. Having a larger data set for new maneuvers or for new areas with which to evaluate or test autonomous vehicle behavior can reduce the risks in operating autonomous vehicles.

In other implementations, the verified simulation system may be used to test various software for autonomous vehicles. Using these tests, the verified simulation system may compare how each of the various software performs in comparison to one another or in comparison to software used in existing runs in the log data.

The technology described herein allows for more fully testing autonomous vehicle software with a smaller amount of log data. The simulation of maneuvers may be run accurately in a real-world location using constructed environment data, and may not require the maneuver to have occurred yet in the real-world location. In other words, this technology provides the opportunity to predict and test how autonomous vehicles may behave in situations and locations that have not yet been tried in the real world. This type of simulation allows for more efficient and complete safety and quality checks for the autonomous vehicle software. This type of simulation also provides opportunities to adjust the software for autonomous vehicles to generate a better ride experience for passengers of an autonomous vehicle and test the adjusted software efficiently. Driving autonomously in the new area may therefore be improved or otherwise customized for features that are specific to the new area.

Example Systems

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 134 and data 132 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 134 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 132 may be retrieved, stored or modified by processor 120 in accordance with the instructions 134. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may have all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio-visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be control computing devices of an autonomous driving computing system or incorporated into vehicle 100. The autonomous driving computing system may be capable of communicating with various components of the vehicle in order to control the movement of vehicle 100 according to the autonomous control software of memory 130 as discussed further below. For example, returning to FIG. 1, computing devices 110 may be in communication with various systems of vehicle 100, such as deceleration system 160, acceleration system 162, steering system 164, signaling system 166, routing system 168, positioning system 170, perception system 172, and power system 174 (i.e. the vehicle's engine or motor) in order to control the movement, speed, etc. of vehicle 100 in accordance with the instructions 134 of memory 130. Again, although these systems are shown as external to computing devices 110, in actuality, these systems may also be incorporated into computing devices 110, again as an autonomous driving computing system for controlling vehicle 100. The autonomous control software may include sections, or logic, directed to controlling or communicating with specific systems of the vehicle 100 or performing specific subprocesses for decisions regarding the operation of the vehicle 100.

As an example, computing devices 110 may interact with one or more actuators of the deceleration system 160 and/or acceleration system 162, such as brakes, accelerator pedal, and/or the engine or motor of the vehicle, in order to control the speed of the vehicle. Similarly, one or more actuators of the steering system 164, such as a steering wheel, steering shaft, and/or pinion and rack in a rack and pinion system, may be used by computing devices 110 in order to control the direction of vehicle 100. For example, if vehicle 100 is configured for use on a road, such as a car or truck, the steering system may include one or more actuators to control the angle of wheels to turn the vehicle. Signaling system 166 may be used by computing devices 110 in order to signal the vehicle's intent to other drivers or vehicles, for example, by lighting turn signals or brake lights when needed.

Routing system 168 may be used by computing devices 110 in order to determine and follow a route to a location. In this regard, the routing system 168 and/or data 132 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Figure 2:
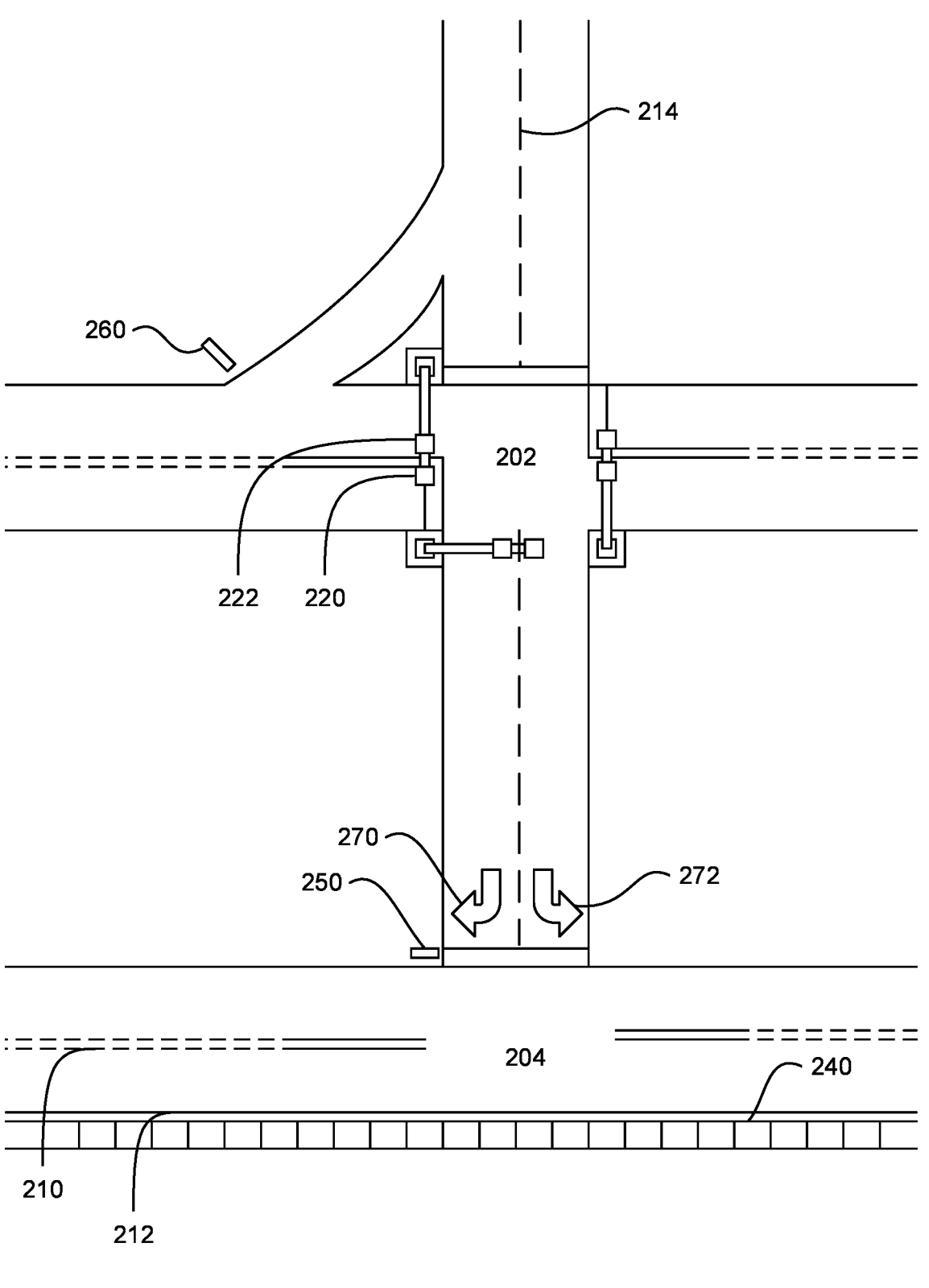
FIG. 2 is an example of map information in accordance with aspects of the disclosure.

FIG. 2 is an example of map information 200 for a section of roadway including intersections 202 and 204. In this example, the map information 200 includes information identifying the shape, location, and other characteristics of lane lines 210, 212, 214, traffic signal lights 220, 222, sidewalk 240, stop sign 250, yield sign 260, and road arrows 270 and 272. Although the map information is depicted herein as an image-based map, the map information need not be entirely image based (for example, raster). For example, the map information may include one or more roadgraphs or graph networks of information such as roads, lanes, intersections, and the connections between these features. Each feature may be stored as graph data and may be associated with information such as a geographic location and whether or not it is linked to other related features, for example, a stop sign may be linked to a road and an intersection, etc. In some examples, the associated data may include grid-based indices of a roadgraph to allow for efficient lookup of certain roadgraph features.

Positioning system 170 may be used by computing devices 110 in order to determine the vehicle's relative or absolute position on a map or on the earth. For example, the position system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 110, other computing devices and combinations of the foregoing.

Figure 3:
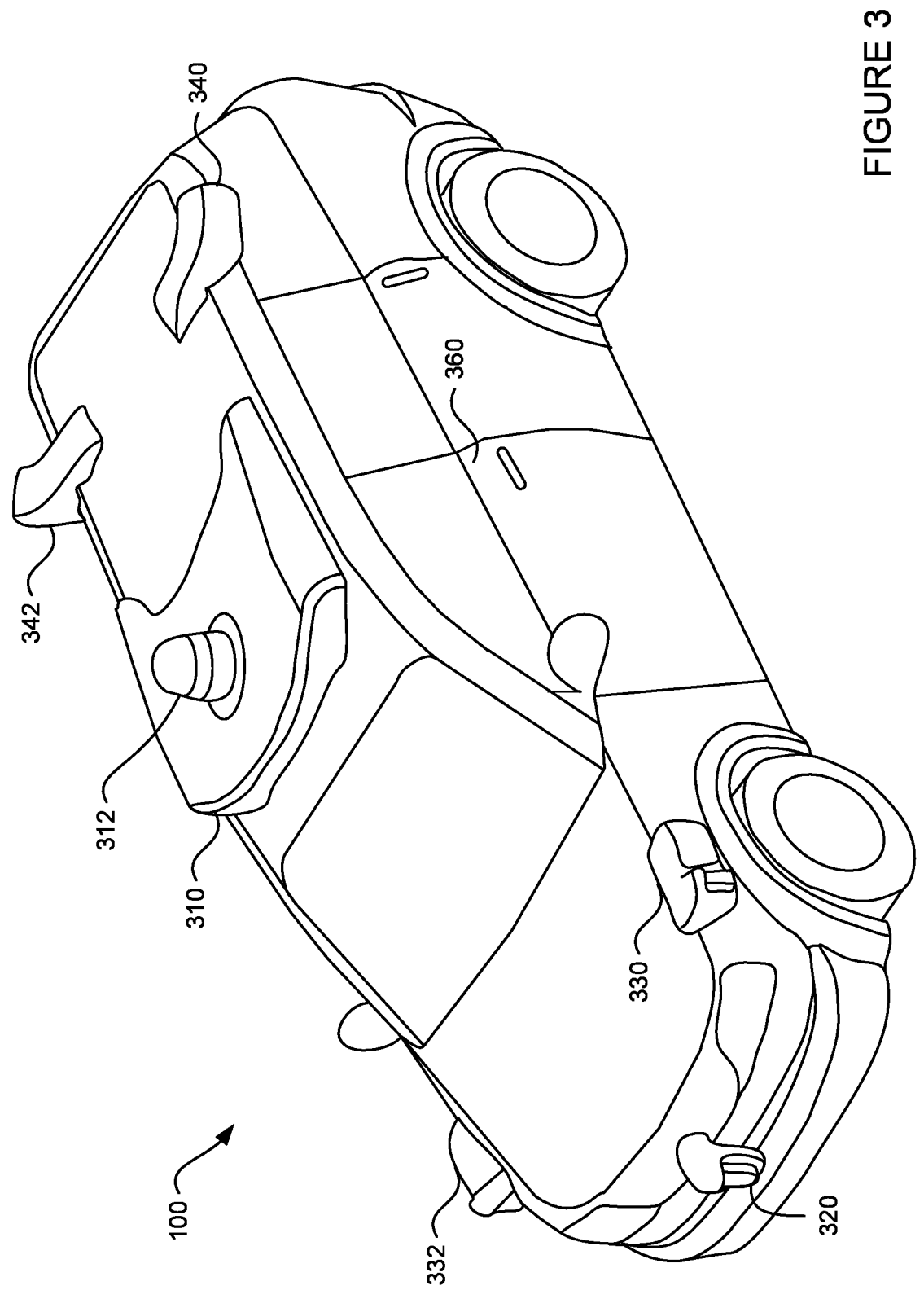
FIG. 3 is an example external view of a vehicle in accordance with aspects of the disclosure.

The perception system 172 also includes one or more components for detecting objects external to the vehicle such as other vehicles, obstacles in the roadway, traffic signals, signs, trees, etc. For example, the perception system 172 may include lasers, sonar, radar, cameras and/or any other detection devices that record data which may be processed by computing device 110. In the case where the vehicle is a passenger vehicle such as a minivan, the minivan may include a laser or other sensors mounted on the roof or other convenient location. For instance, FIG. 3 is an example external view of vehicle 100. In this example, roof-top housing 310 and dome housing 312 may include a LIDAR sensor as well as various cameras and radar units. In addition, housing 320 located at the front end of vehicle 100 and housings 330, 332 on the driver's and passenger's sides of the vehicle may each store a LIDAR sensor. For example, housing 330 is located in front of driver door 360. Vehicle 100 also includes housings 340, 342 for radar units and/or cameras also located on the roof of vehicle 100. Additional radar units and cameras (not shown) may be located at the front and rear ends of vehicle 100 and/or on other positions along the roof or roof-top housing 310.

The computing devices 110 may control the direction and speed of the vehicle by controlling various components. By way of example, computing devices 110 may navigate the vehicle to a destination location completely autonomously using data from the detailed map information and routing system 168. Computing devices 110 may use the positioning system 170 to determine the vehicle's location and perception system 172 to detect and respond to objects when needed to reach the location safely. In order to do so, computing devices 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
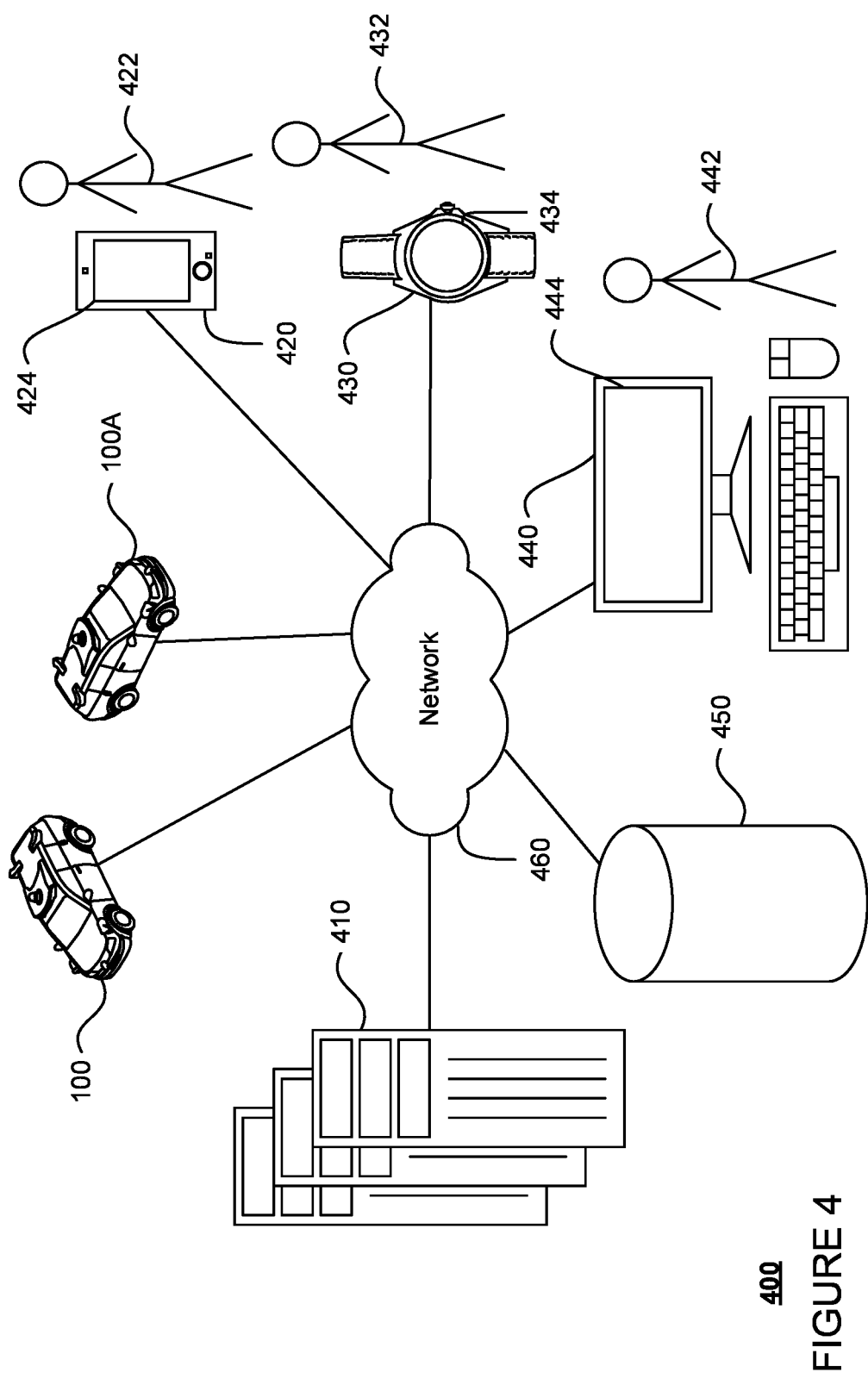
FIG. 4 is a pictorial diagram of an example system in accordance with aspects of the disclosure.
Figure 5:
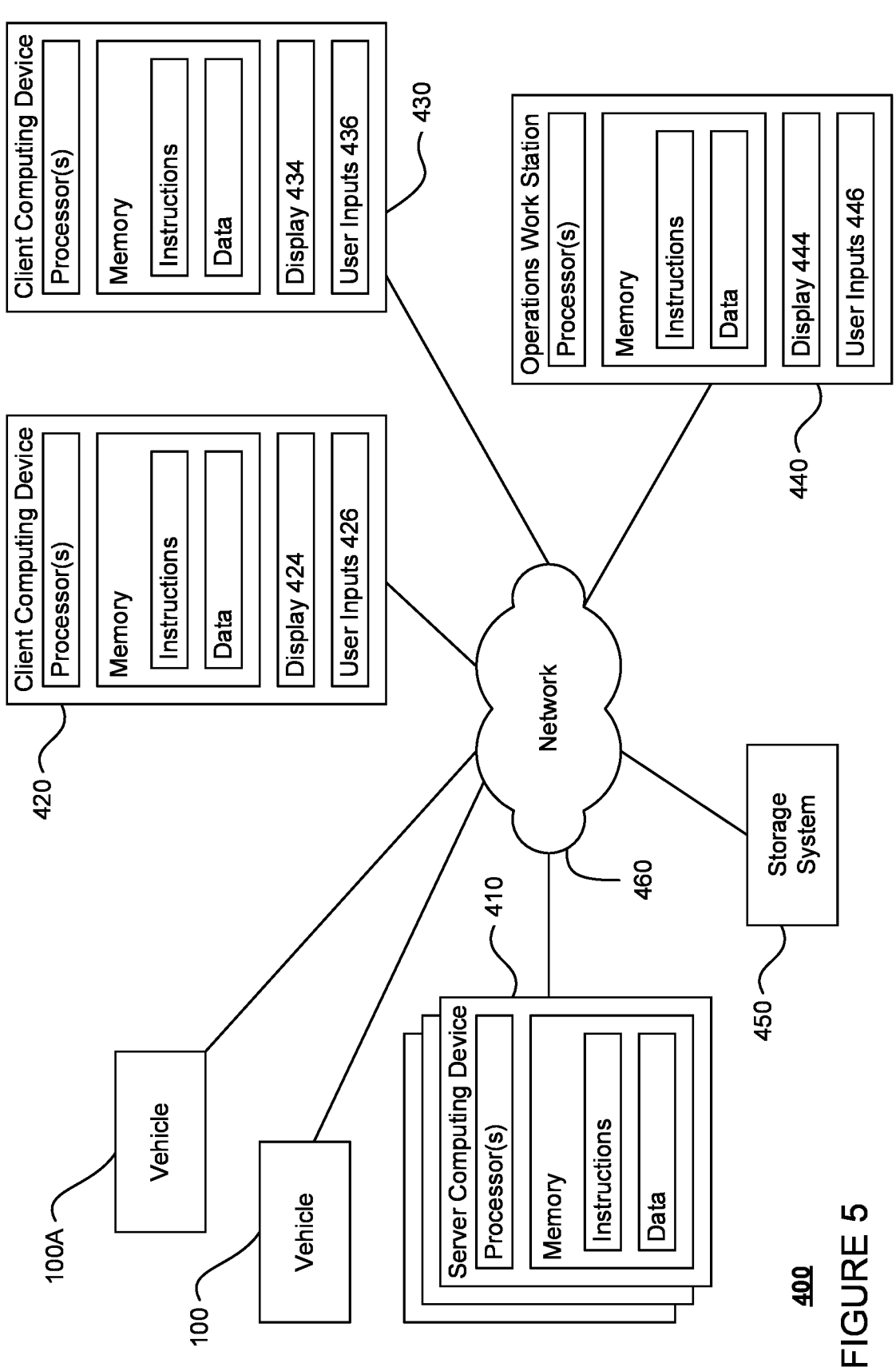
FIG. 5 is a functional diagram of the system of FIG. 4 in accordance with aspects of the disclosure.

Computing device 110 of vehicle 100 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 100 and vehicle 100A, which may be configured same as or similarly to vehicle 100. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 120, memory 130, data 132, and instructions 134 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a simulation system which can be used to validate autonomous control software which vehicles such as vehicle 100 and vehicle 100A may use to operate in an autonomous driving mode. The simulation system may additionally or alternatively be used to run simulations for the autonomous control software as further described below. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 4, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example the user may input information using a small keyboard, a keypad, microphone, using visual signals with a camera, or a touch screen.

In some examples, client computing device 440 may be an operations workstation used by an administrator or operator to review simulation outcomes, handover times, and validation information. Although only a single operations workstation 440 is shown in FIGS. 4 and 5, any number of such work stations may be included in a typical system. Moreover, although the operations workstation is depicted as a desktop computer, operations workstations may include various types of personal computing devices such as laptops, netbooks, tablet computers, etc.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store log data. This log data may include, for instance, sensor data generated by a perception system, such as perception system 172 of vehicle 100 as the vehicle is being driven autonomously or manually. Additionally or alternatively, the log data may be generated from one or more sensors positioned along a roadway or mounted on another type of vehicle, such as an aerial vehicle. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The log data may also include "event" data identifying different types of events such as collisions or near collisions with other objects, planned trajectories describing a planned geometry and/or speed for a potential path of the vehicle 100, actual locations of the vehicle at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation.

In addition, the storage system 450 may also store autonomous control software which is to be used by vehicles, such as vehicle 100, to operate a vehicle in an autonomous driving mode. This autonomous control software stored in the storage system 450 may be a version which has not yet been validated. Once validated, the autonomous control software may be sent, for instance, to memory 130 of vehicle 100 in order to be used by computing devices 110 to control vehicle 100 in an autonomous driving mode.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

A given area may be selected for a set of simulations based on log data. Selecting the given area may include selecting a point in time or a specific location in the given area related to where the set of simulations would start. The log data may include data that was collected from one or more systems mounted on or in a vehicle driven along a path through the given area. The vehicle may or may not be driving autonomously through the given area. The log data may include characteristics of features detected in the vehicle's environment while the vehicle drives along the path, such as road agents, objects, traffic control features, or road features. The given area may be selected based on feature criteria of the given area, such as a particular type of object, a particular type of road feature, or a particular road agent behavior. For example, one or more processors 410 of a simulation system or user-inputted selections may identify the feature criteria. Additionally or alternatively, the given area may be selected based on a particular maneuver performed by the vehicle that is stored in the log data. The particular maneuver may be, for example, a pullover maneuver. However, this technology does not require the existence of the particular maneuver in the given area in the log data, as described further herein.

The given area may include a point at which the feature criteria or the particular maneuver appears in the log data. A time frame of about twenty seconds from the vehicle's run in the log data may be used to identify the given area. For example, an area may include the vehicle's location is ten seconds before where the feature criteria is and the vehicle's location ten seconds after where the feature criteria is. In this implementation, the point in time or the vehicle's location ten seconds before where the feature criteria is may be selected as the start point of the set of simulations. Different time frames may be used in other implementations. In another implementation, the given area may be centered about where the particular maneuver occurs. Alternatively, the given area may be defined by user input.

Figure 6:
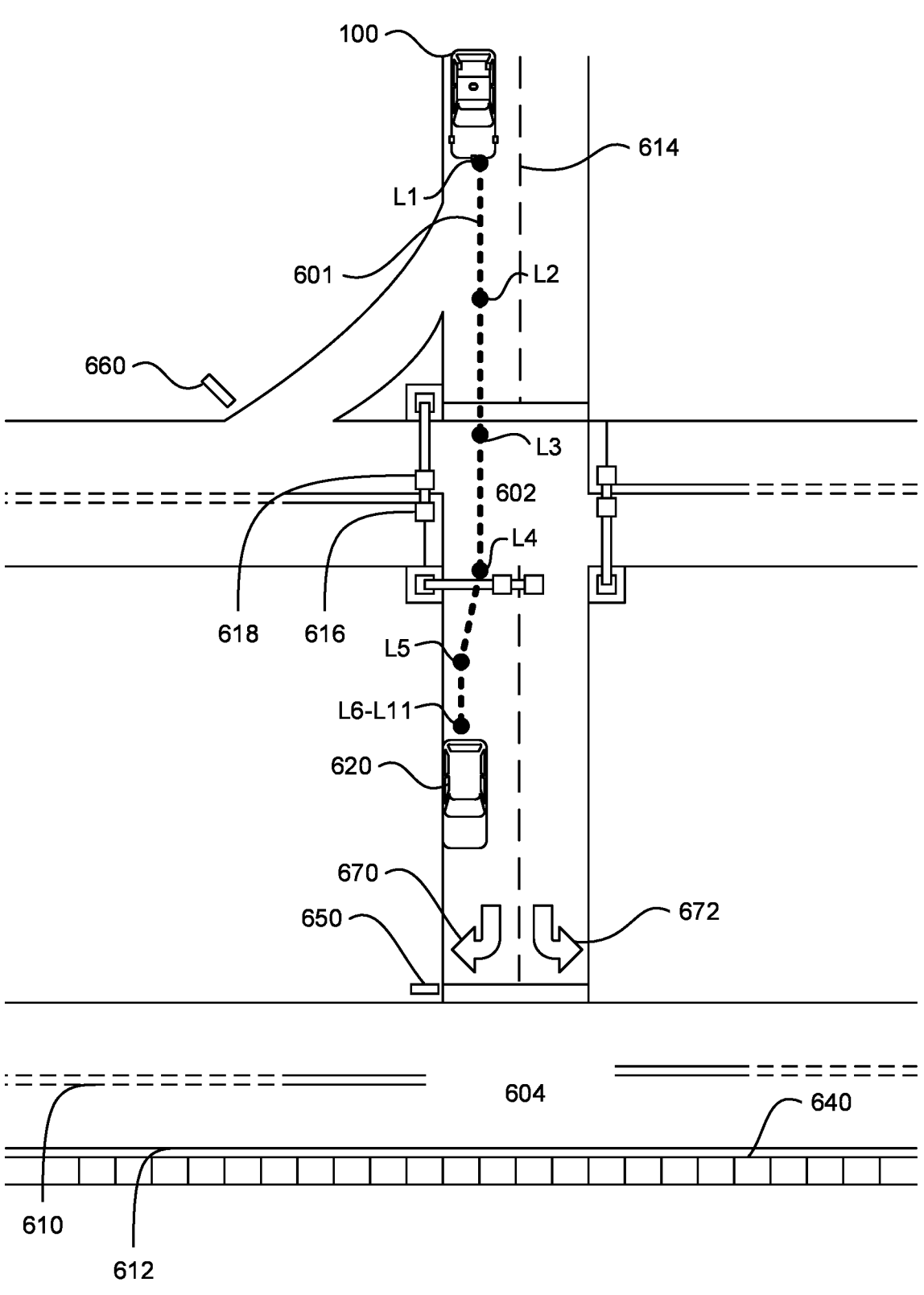
FIG. 6 is an example representation of geographic area in accordance with aspects of the disclosure.

As shown in FIG. 6, a given area 600 corresponding to map information 200 may be selected based on criteria including a vehicle parked along a curb and/or based on a pullover maneuver appearing in the log data. An agent vehicle 620 is in a same lane as a vehicle 100 and is parked along the curb in between the initial location L1 of the autonomous vehicle and the intersection 604. In this example, intersections 602 and 604 correspond to intersections 202 and 204, respectively. This regard, the shape, location, and other characteristics of lane lines 610, 612, 614, traffic signal lights 616, 618, sidewalk 640, stop sign 650, yield sign 660, and road arrows 670, 672 corresponds to the shape, location and other characteristics of lane lines 210, 212, 214, traffic signal lights 220, 222, sidewalk 240, stop sign 250, yield sign 260, road arrows 270 and 272.

The selected given area 600 may include a logged run 601 including the locations logged by the vehicle 100. In the logged run 601, the vehicle is approaching an intersection 604 from an initial location L1 in a first direction. In FIG. 6, the given run 601 is broken down into a plurality of subsequent vehicle locations L2-L11 at particular time intervals. The time intervals may correspond to the refresh rate for the sensors or detection devices in the perception system 172, such as every $\frac{1}{10}$ second, or more or less. For the sake of simplicity, the given run 601 is shown broken down into seven total vehicle locations L1-L11, with a time interval of one second apart from each other. The pullover maneuver is completed at L6 where the vehicle 100 pulls over and parks behind agent vehicle 620, after which the subsequent vehicle locations L7-L11 show the vehicle remaining at the parked location L6.

The one or more processors 410 may construct environment data for the given area using the log data. The environment data includes input features or signals for the vehicle's computing devices running the software, such as reconstructions of objects in the given area that may be detected by the vehicle's perception system. The reconstructions of objects may represent the objects as closely as possible to the real-world objects. For the given area, data from the log data related to features in the vehicle's environment may be retrieved by the one or more processors 410 for an environment reconstruction of the given area. The retrieved log data may include data related to characteristics of static scenery and perception objects in the given area. The retrieved data may also include data collected on a different day, data collected by different vehicles or devices, or map data. For example, the retrieved log data may be from different runs from the same or different vehicle, or may include data collected from a mobile phone, satellite imaging system, a streetview image database, or cached reduced form of objects. The constructed environment data may include any combination of static scenery, non-static scenery, road agents, or other objects in the given area. The constructed environment data may include a scaled mesh representing objects in the environment. The scaled mesh may include three-dimensional points based on LIDAR data in the logged data or other points or surfaces defining shapes or surfaces of the objects.

In the example shown in FIG. 6, the log data for the given area 600 includes static objects in the environment of the vehicle 100, such as traffic signal lights 616, 618, stop sign 650, yield sign 660, and agent vehicle 620. For the traffic signal lights 616, 618, the stop sign 650, and/or the yield sign 650, the server computing devices 410 may use known dimensions, map information 200, and/or sensor data collected from different angles with respect to these static objects to construct the scaled mesh representing the entirety of each of these objects in the simulated environment. For the agent vehicle 620, the server computing devices 410 may use known dimensions of the make and model of the agent vehicle 620 to construct the scaled mesh representing the entirety of the agent vehicle 620 in the simulated environment. The resulting environment data 700, shown in FIG. 7, includes traffic lights 716, 718, stop sign 750, yield sign 760, and agent vehicle 720 constructed as described above. In addition, the environment data 700 includes details corresponding road features from map information and/or sensor data to recreate lane lines 610, 612, 614, sidewalk 640, and road arrows 670 and 672, such as lane line 714, intersection 702, and road arrows 770, 772. The environment data 700 then may be used in simulating runs of an autonomous vehicle using an autonomous vehicle software as discussed further below.

Parameters may be set for a set of simulations, including a particular maneuver and/or a start time. For example, the particular maneuver may be a pullover maneuver where a simulated vehicle's computing devices pulls over to a location along a side of the road and stops. Other maneuvers may be, for example, lane changes or merges. The start time may correspond to a point in time or a point on the road in the simulation where the simulated vehicle's computing devices start to perform the particular maneuver. The parameters may be related to a particular run driven by a vehicle in the log data, such as matching the start location L1 and the pullover maneuver in the logged run 601 shown in FIG. 6. In other examples, the parameters may differ from the runs in the log data, such as inserting a pullover maneuver where one is not logged in the selected area. For instance, the start time for the particular maneuver may be different from the runs in the log data to result in a different decision made by the simulated vehicle's computing devices than the logged decision in the log data. When trying to trigger a different decision for a pullover maneuver, the start time may be after where the pullover maneuver is performed in the log data. In some implementations, the parameters may be set according to user input received from a user.

The one or more processors 410 may run the set of simulations for a particular maneuver using the constructed environment data according to the same parameters. In some simulations, a destination may be set in the given area, and the autonomous vehicle software may be run to navigate a simulated autonomous vehicle to perform the maneuver as it approaches the destination. Portions of a logged run may be used in the simulation. The set of simulations includes one or more of (i) a decision points related to instances in the particular maneuver in the given area, such as turning point or an end point, (ii) decision process playthrough for the particular maneuver using the autonomous vehicle software to see how the process occurs at each point along a the vehicle's route, (iii) maneuver playthrough to see how the particular maneuver interacts with agents and objects in the environment, and (iv) replay of the particular maneuver in a run from log data.

The decision instances simulation may be performed based on the given area at a given point in time, and therefore may not require simulating the vehicle's systems, the vehicle's route, road agent's trajectory, or other object or agent behavior over time. The resulting signal or data may be a representation of one or more locations for starting a maneuver, ending a maneuver, or a direction change in a maneuver. The decision instances simulation may be a selection made by simulated vehicle's computing devices given the constructed environment data, such as by running a portion of the autonomous vehicle software responsible for making such a selection. In some alternative implementations, the decision instances simulation may be an offboard selection by actual or simulated server computing devices or a selection made by a human operator.

Figures 7A, 7B:
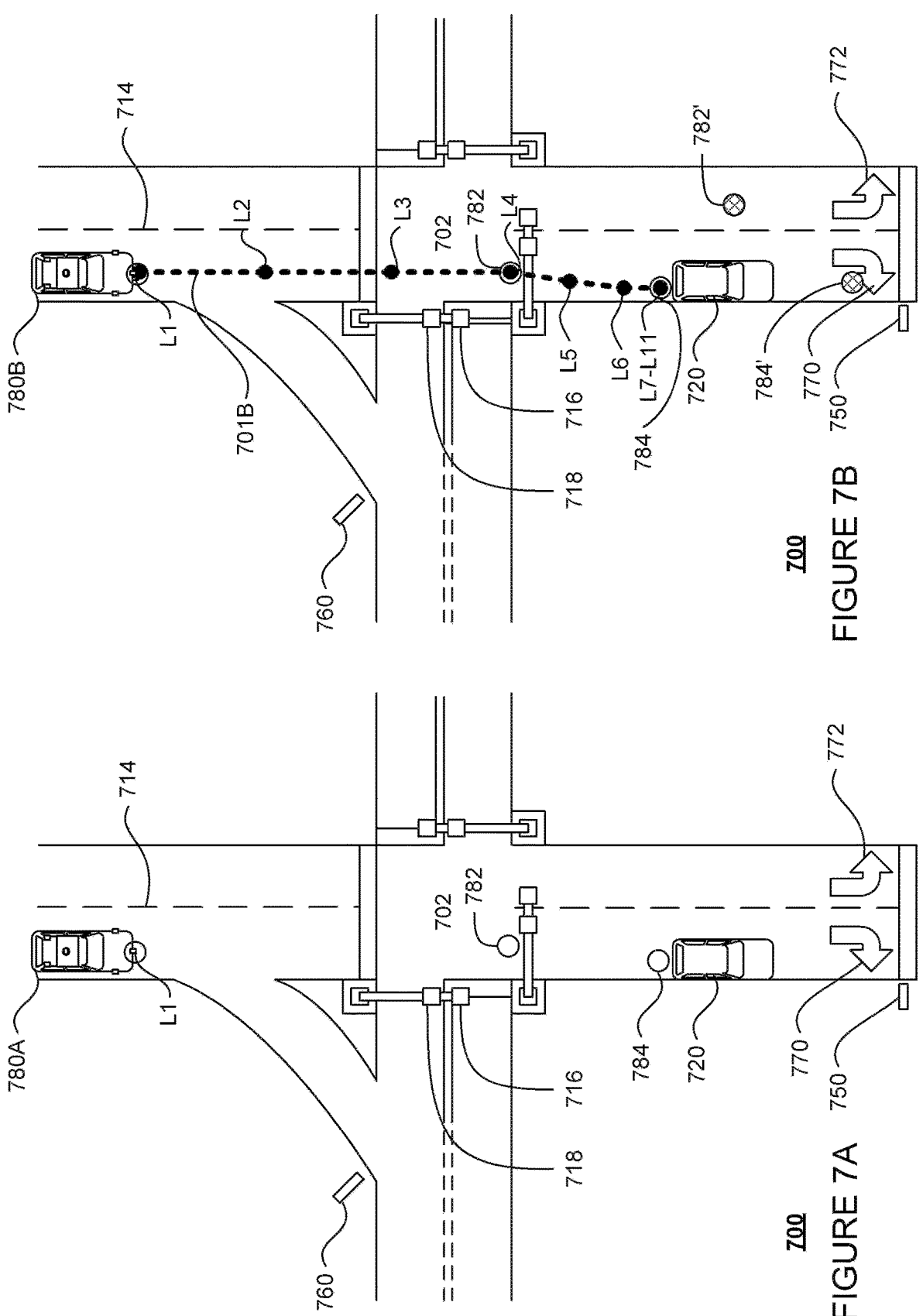
FIGS. 7A-7D are example representations of various simulations in accordance with aspects of the disclosure.

As shown in FIG. 7A, the decision instances simulation of a pullover maneuver in the area 600 determines where a start and end to the maneuver for a simulated vehicle 780A running parts of the autonomous vehicle software. In this scenario, the decision instances simulation results in a start location 782 and an end location 784 for the pullover maneuver. The start location 782 about where the vehicle 100 begins to curve towards the roadedge in the logged run 601, and the end location 784 is about where the vehicle 100 parks along the roadedge in the logged run 601. In other scenarios, the locations may differ from what is in the logged run or may not have a comparable logged run for comparison.

The decision process simulation may be performed by simulating the vehicle's route over time based on processes in the autonomous vehicle software executed to do the maneuver. This simulation may include the same given area and other parameters as the decision instances simulation, and may further add one or more simulated vehicle software or systems to play out how the parameters of the decision instances simulation play out over time. For example, the processes in the simulated vehicle software may have built in constraints, such as limits of a sensor field of view, or may react to agents in the simulation, which may in some scenarios result in different selections than those made in the decision instances simulation. The decision process simulation may also not require simulating all of the vehicle's systems, such as sensors, reactions of road agents to the vehicle's route over time, or moving objects generally.

As shown in FIG. 7B, the decision process simulation of the pullover maneuver in the area 600 may play out a route for simulated vehicle 780B over time by running parts of the autonomous vehicle software. In this scenario, the simulated vehicle 780B starts at L1 in the simulation. It is shown in this decision process simulation that second options for a start location and an end location were determined at the outset before the start location 782 and the end location 784 were selected. As shown in FIG. 7B, the second start location 782' is to the side of agent vehicle 720, and the second end location 784' is in front of the agent vehicle 720. The second option for the pullover maneuver in the given area is to pass the agent vehicle 720 in the adjacent lane and park along the roadedge in front of the agent vehicle 720 rather than behind the agent vehicle 720. It is further shown in this decision process simulation that the resulting simulated run 701B includes vehicle locations L1-L11. These simulated L1-L4 are the same or similar to that of the logged run 601, while the simulated L5-L7 are required to reach about the same end location as logged L5-L6. This simulated pullover maneuver therefore differs from the logged pullover maneuver in the speed at which it approaches the end location of the maneuver behind the parked agent vehicle 720.

The novel maneuver simulation may be performed by simulating everything for the particular maneuver. In other words, the same software and systems operating in an autonomous vehicle may be simulated in the same given area and other parameters as the decision instances simulation and the decision process simulation. In some novel maneuver simulations, the simulated vehicle's pose may diverge significantly from any vehicle behavior in log data, such as by a block or more. In other novel maneuver simulations, at least part of the vehicle's route may be programmed to be the same as a run the log data, such as a pullover location or an entire route. The novel maneuver simulation includes simulated road agents that travel along the road around the simulated vehicle beyond what exists in the log data, such as in the areas where the simulated vehicle diverges from vehicle behavior in the log data.

Figures 7C, 7D:
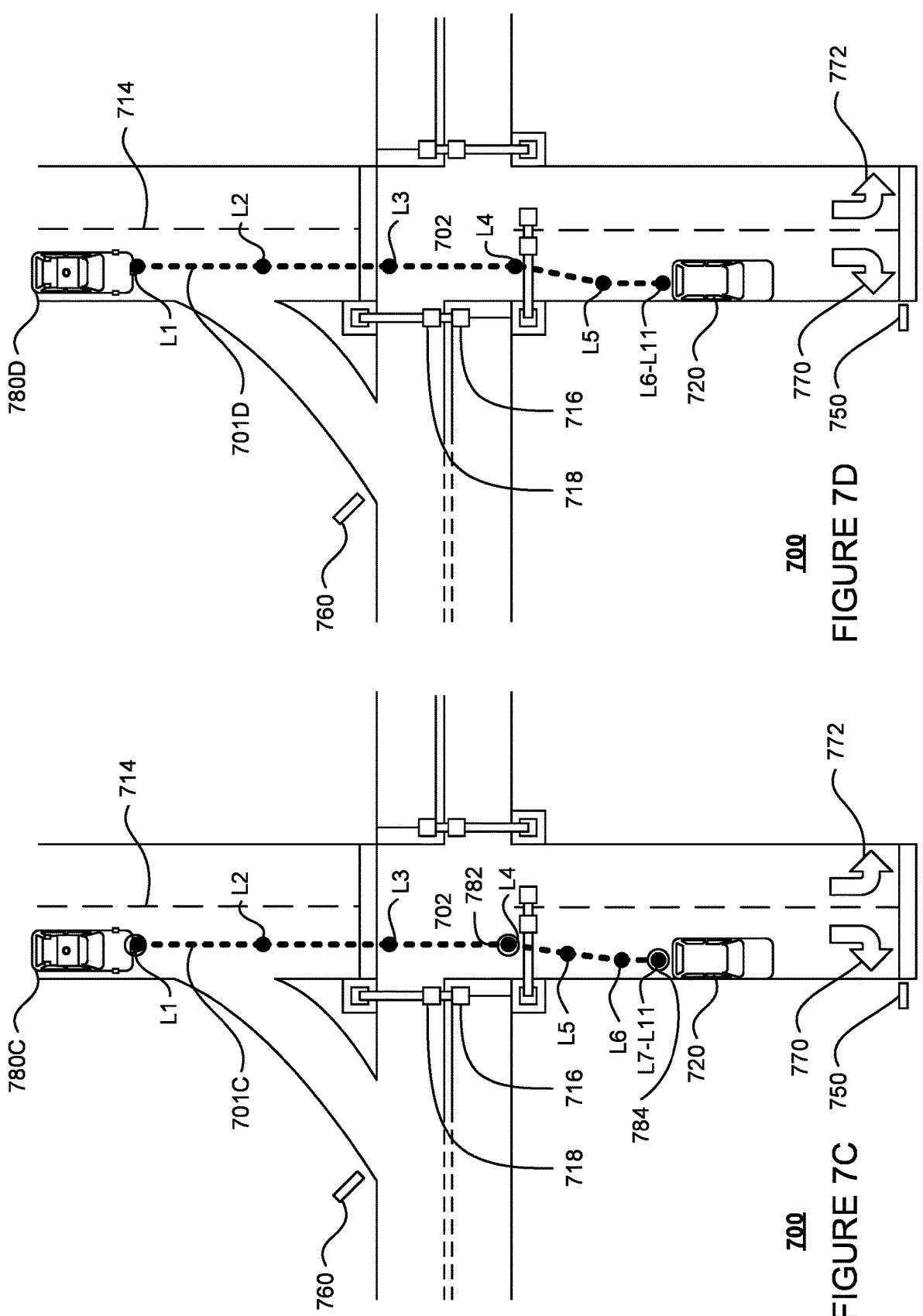

As shown in FIG. 7C, the novel maneuver simulation of the pullover maneuver in the area 600 may play out a route for simulated vehicle 780C over time by running the autonomous vehicle software, including sensor logic and/or steering programs. In this scenario, the simulated vehicle 780C starts at L1 in the simulation. It is shown in this novel maneuver simulation that the resulting simulated run 701C matches the simulated run 701B of the decision process simulation shown in FIG. 7B. This simulated pullover maneuver therefore also differs from the logged pullover maneuver in the speed at which it approaches the end location of the maneuver behind the parked agent vehicle 720.

The replay simulation may be performed by simulating everything according to the log data for a particular run, if there is a particular run for the particular maneuver in the given area available in the log data. Re-running the particular run in simulation allows for metrics to be extracted and other evaluation.

As shown in FIG. 7D, the replay simulation of the pullover maneuver in the area 600 replays the logged run 601 in simulation. The simulated vehicle 780D travels along the logged 601, such that the vehicle locations L1-L11 match those of the logged run 601.

The one or more processors 410 or a separate system may extract one or more metrics from the set of simulations. For each simulation in the set of simulations, the same one or more metrics may be extracted. As shown in flow diagram 800 shown in FIG. 8, details 802 of a given simulation in the set, such as locations over time, decisions over time, data from vehicle systems, etc., may be used to determine one or more metrics 810. The one or more metrics may include compliance metrics 812 (e.g., an amount of overlap with a driveway or no parking zone), location metrics 814 (e.g., distance or angle to the curb if we are picking up a passenger), scene impact metrics 816 (e.g., degree to which other road agents were delayed or otherwise inconvenienced), overall quality metric 818 (i.e., a weighted combination of the other metrics), or improvement cost metrics 820 (i.e., costs or cost differences of a better known location for the particular maneuver, such as if there was a non-doubleparking option available).

Figure 8:
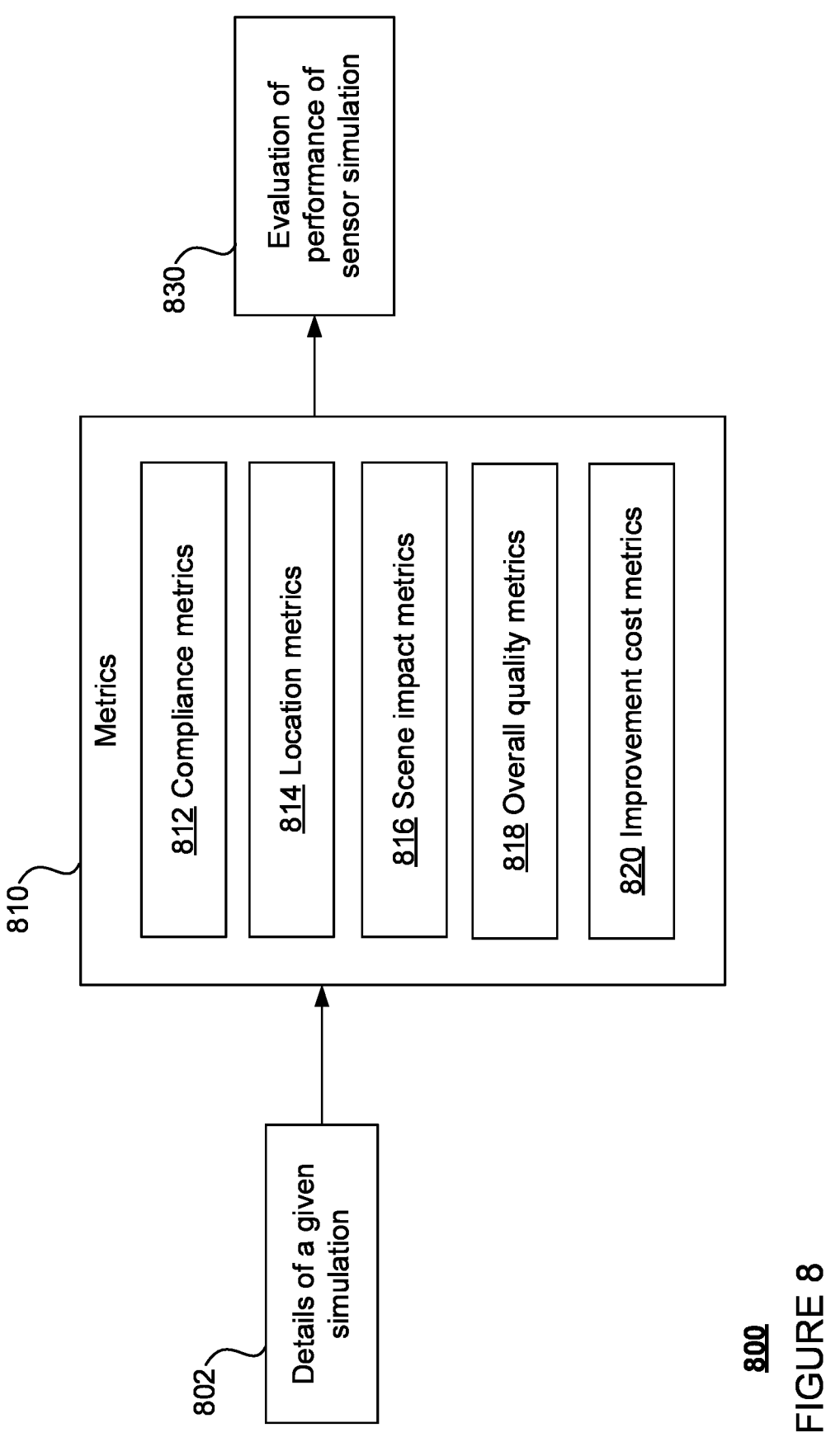
FIG. 8 is a flow diagram of an example method in accordance with aspects of the disclosure.

The one or more processors 410 may perform an evaluation 830 of the set of simulations using the one or more metrics 810, as shown in FIG. 8. The evaluation 830 may include determining where bad maneuvers happened and why bad maneuvers happened. For example, the one or more metrics for a first simulation in the set may be compared with the one or more metrics for a second simulation in the set. Comparisons between different pairs of simulations may reveal different insights about the autonomous vehicle software.

Comparing the decision process simulation and the decision instances simulation corresponding to the same parameters may show when the selected location from the selection simulation either became the final selected location or was rejected in the decision process simulation. As shown in the decision process simulation in FIG. 7B, the locations 782, 784 from the decision instance simulation in FIG. 7A were selected over the locations 782',784' over time. This comparison may use the location metrics or other metrics and may provide insight into how strongly the selected location was latched onto by the autonomous vehicle software. For example, because the decision instances simulation may be unlimited by a sensor field of view that is part of the decision process simulation, a divergence between the selected location from the decision instances simulation and the selected locations from the decision process simulation may be attributed to the sensor field of view. In another example, a point in time in which the simulated vehicle software selects the selected location during the decision process simulation may be used to determine a degree of latch for the selected location. When the selected location is determined as the final selected location earlier in the simulation, the greater the latch. On the other hand, when the selected location is rejected earlier in the simulation, the lesser the latch. This comparison also may reveal what caused changes to a selected location from the decision instances simulation that resulted in a different corresponding location in the decision process simulation. For example, steering software, vehicle limitations, road agents, or other factors may cause the originally selected location, such as a pullover location, to be impossible, impractical, or less safe. As a result, the simulated vehicle in the decision process simulation may end up in a pullover location that is further down the roadedge than the originally selected location.

Comparing the novel maneuver simulation and the replay simulation (if available) corresponding to the same maneuver in the same given area may show how well the simulation system is working or how changes in the autonomous vehicle software affect performance of the particular maneuver. The goal of the simulation of the same autonomous vehicle software as the replayed run is to most closely match log data generated by the autonomous vehicle software in real world use. Therefore, the simulation system is operating best when the metrics for these two simulations match or closely match. This increases confidence that the simulation system is capable of accurately portraying novel maneuvers in other scenarios with different parameters. If the metrics differ greatly, the simulation system may need to be updated. For example, the manner in which the novel maneuver simulation is being generated, inaccuracies in the constructed environment data, or errors in actual or simulated sensor data may cause the differences between these two simulations.

Comparing the metrics of the novel maneuver simulation in FIG. 7C and those of the replay simulation in FIG. 7D may show that the simulated run 701C is similar to those of replayed logged run 701D. However, the metrics may reflect that there are differences in the timings of the two runs, namely that the it takes an extra second for the simulated vehicle 780C to reach the parked location behind agent vehicle 720 than the replay simulated vehicle 780D. These timing differences may be due to the autonomous vehicle software reacting to uncertainties regarding the location of the agent vehicle 720 caused by incorrect inputs for the novel maneuver simulation, an inaccurate reconstruction of agent vehicle 720, or an error in simulated sensor data for the vehicle 780C.

Comparing the decision instances simulation to the replay simulation (if available) or the novel maneuver simulation (if the replay simulation is not available) corresponding to the same maneuver in the same given area may show whether the selections produced by the decision instances simulation is a good predictor of actual, realistic selections. For example, if location metrics or other metrics indicate that a selected final location from the decision instances simulation matches or closely matches that from the replay simulation or the novel maneuver simulation, there is increased confidence that the simpler, faster decision instances simulation can be used where it is not possible or practicable to run the replay simulation or novel maneuver simulation. The decision instances simulation may then be used to produce quicker, more readily available simulations or decision processes. For example, these resulting simulations or processes may be stored and run by onboard systems rather by an offboard server.

Comparing the metrics of decision instances simulation in FIG. 7A and those of the replay simulation in FIG. 7D may show that the selected start and end locations 782, 784 for the pullover maneuver closely match the start and end locations of the pullover maneuver in the logged run. Based on this comparison, a confidence level of the simulation system's prediction accuracy for pullover maneuvers may be increased.

Comparing the decision process simulation and the replay simulation (if available) may show how well the simulation system is working when the same autonomous vehicle software is used in the simulation as in the replayed run in a same or similar manner as described above. As mentioned above, the simulation system is operating best when the metrics for these two simulations match or closely match. If the metrics differ greatly, the simulation system may need to be updated. When divergences exist, this comparison may show what causes the divergences. For example, the comparison may reveal whether a divergence was based mostly on a difference in a selected location generated by the decision instances simulation or mostly on a difference in behavior of simulated vehicle software or systems in the decision process simulation. Similar to comparing the metrics of novel maneuver simulation in FIG. 7C and those of replay simulation in FIG. 7D, comparing the metrics of decision process simulation in FIG. 7B and those of the replay simulation in FIG. 7D may show that the simulated run 701B is similar to those of replayed logged run 701D, as well as that there are differences in the timings of the two runs. The comparison may show that the selected start and end locations 782, 784 in FIG. 7B closely match the respective locations in the simulated logged run 701D, but that the pullover maneuver in FIG. 7B takes one second longer than the pullover maneuver in FIG. 7D. As such, the comparison may show that the differences between the two runs is based on a difference in behavior of simulated vehicle software or systems, and not on the difference in the selected locations.

Alternatively, comparing the decision process simulation and the replay simulation may show how changes in the autonomous vehicle software affect performance of the particular maneuver. In this scenario, the autonomous vehicle software simulated in the decision process simulation may differ from the autonomous vehicle software used in the replayed run. As such, the differences between the metrics of these two simulations may be attributed to the differences between the two software. The comparison may be used to determine if the changes resulted in an improvement to performance of the particular maneuver.

When there are no logs for the given area and the replay simulation is therefore unavailable, comparing the decision process simulation and the novel maneuver simulation may also show how well the simulation system is working in a same or similar manner as described above. The metrics for these two simulations should be similar or the same because the novel maneuver simulation builds off the decision process simulation. Therefore, if the metrics for these two simulations differ greatly, the differences may be attributed to how the novel maneuver simulation is generated, and the simulation system may need to be updated accordingly. For example, inaccuracies in the constructed environment data or errors in actual or simulated sensor data may cause major differences between these two simulations. As the simulated run 701B using the decision process simulation in FIG. 7B and the simulated run 701C using the novel maneuver simulation in FIG. 7C are the same, the comparison may show that the novel maneuver simulation is generated accurately using the same parameters as the decision process simulation.

An adjustment to the software may be determined based on the evaluation to cause the software to operate the autonomous vehicle to avoid making bad maneuvers. For example, the adjustment may include altering a parameter, such as weights between blocking a driveway or double parking on a road, a passenger discomfort level permitted for a type of location or a type of maneuver, or an amount of buffer or affinity given to other detected vehicles. For example, based on the metrics of the second locations 782', 784' considered during the decision process simulation in FIG. 7B, an adjustment may be made to lower weights for parking within 50 feet of a stop sign and increase weights for parking within 50 feet of an intersection without a stop sign. This adjustment may reduce length of time the software takes to reject locations 782', 784' and select locations 782 and 784. In some implementations, the adjustment to the software may be made using a machine learning system, such as a machine learning system that uses a model to test and select parameters that increase the likelihood that the simulated autonomous vehicle makes good maneuvers.

In addition, using the comparisons of the replay simulation (where available) to any other type of simulation in the evaluations as described above, the simulation system may be verified to generate realistic autonomous vehicle behavior. For instance, a given simulation run by the simulation system may be determined to have metrics that are within an acceptable range of metrics of the replay simulation in at least a threshold amount of the evaluations. The acceptable range may be, for example, within 10% of the metrics of the replay simulation, or more or less. The threshold amount may be, for example, at least 90% of the total evaluations, or more or less. Other criteria for verification may be used to determine that the simulation system is able to generate simulations that match the behavior of autonomous vehicles in the replay simulation to an acceptable degree. Based on the simulations shown in FIGS. 7A-7D, the simulation system may be verified. Alternatively, the simulation system may be adjusted to more closely match the metrics for the simulations in FIGS. 7A-7C and that of FIG. 7D before the simulation system is verified.

Once verified, the simulation system may be used to generate simulations of autonomous vehicle behavior that are for new scenarios. The new scenarios may be in a different area, include different road agents or objects, occur at different days or times, or otherwise vary from existing runs in log data. The verified simulation system may also be used to generate a large data set from which patterns of autonomous vehicle behavior may be extracted. Additionally, the new scenarios may be in an area not yet reached by an autonomous vehicle fleet, such as for an area where there is a planned launch of an autonomous vehicle fleet. The verified simulation system may therefore be used to test autonomous vehicle behavior in completely new situations before ever launching an autonomous vehicle in that kind of situation.

In other implementations, the verified simulation system may be used to test various software for autonomous vehicles. Using these tests, the verified simulation system may compare how each of the various software performs in comparison to one another or in comparison to software used in existing runs in the log data.

Additionally or alternatively, an adjustment to the simulation system may be determined based on the evaluation to reduce inconsistencies or discrepancies discovered in the evaluation.

FIG. 9 shows an example flow diagram 900 of some of the methods for evaluating a simulation system using a set of simulations, which may be performed by one or more processors such as processors of computing devices 410. For instance, at block 910, a given run may be selected for a set of simulations based on log data. At block 920, environment data may be constructed for the given area using the log data. At block 930, the set of simulations for a particular maneuver may be performed using the environment data and the same parameters. The set of simulations may include a decision instances simulation, a decision process simulation, a novel maneuver simulation, and/or a replay simulation. At block 940, one or more metrics may be extracted from the set of simulations. At block 950, an evaluation of the set of simulations may be performed using the one or more metrics. For example, the one or more metrics for a first simulation in the set may be compared with the one or more metrics for a second simulation in the set. At block 960, an adjustment to an autonomous vehicle software may be determined based on the evaluation. Additionally or alternatively to block 960, a simulation system may be verified based on the evaluation at block 970, and the simulation system may be used to generate a new simulation of a new scenario at block 980.

The technology described herein allows for more fully testing autonomous vehicle software with a smaller amount of log data. The simulation of maneuvers may be run accurately in a real-world location using constructed environment data, and may not require the maneuver to have occurred yet in the real-world location. In other words, this technology provides the opportunity to predict and test how autonomous vehicles may behave in situations and locations that have not yet been tried in the real world. This type of simulation allows for more efficient and complete safety checks for the autonomous vehicle software. This type of simulation also provides opportunities to adjust the software for autonomous vehicles to generate a better ride experience for passengers of an autonomous vehicle and test the adjusted software efficiently. Driving autonomously in the new area may therefore be improved or otherwise customized for features that are specific to the new area.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method comprising:

receiving, by one or more processors, log data collected for a given area by sensors of an autonomous vehicle;

generating, by the one or more processors from the log data, environment data for the given area, the environment data including one or more reconstructions of one or more objects detected in the given area;

identifying, by the one or more processors using the log data, a logged start location and a logged end location associated with a logged run of a particular maneuver previously performed by the autonomous vehicle along a logged path, wherein identifying the logged start location and the logged end location further includes replaying the logged run of the particular maneuver previously performed by the autonomous vehicle along the logged path;

performing, by the one or more processors using autonomous vehicle software, a simulated run of the particular maneuver by a simulated autonomous vehicle using the environment data generated from the log data, wherein the simulated run of the particular maneuver (i) includes one or more respective locations at which the autonomous vehicle software generates one or more driving decisions while the simulated autonomous vehicle performs the particular maneuver and (ii) does not include responses of road agents while the simulated autonomous vehicle performs the particular maneuver;

determining, by the one or more processors, a simulated start location and a simulated end location associated with the simulated run of the particular maneuver;

determining, by the one or more processors, whether the simulated start location differs from the logged start location;

determining, by the one or more processors, whether the simulated end location differs from the logged end location; and evaluating, by the one or more processors, the autonomous vehicle software based at least on:

whether the simulated start location is determined to differ from the logged start location; and whether the simulated end location is determined to differ from the logged end location.

2. The method of claim 1, wherein the given area includes a point at which the particular maneuver appears in the log data.

3. The method of claim 1, wherein generating the environment data includes reconstructing real-world objects based on characteristics of the real-world objects.

4. The method of claim 1, further comprising selecting, by the one or more processors, the given area based on feature criteria.

5. The method of claim 1, further comprising selecting, by the one or more processors, the given area based on user input.

6. The method of claim 1, wherein evaluating the autonomous vehicle software is further based on at least one of compliance metrics, location metrics, scene impact metrics, overall quality metrics, and improvement cost metrics.

7. The method of claim 1, wherein the particular maneuver is a pullover maneuver, wherein a vehicle determines a location to pullover and stop.

8. The method of claim 1, wherein replaying the logged run of the particular maneuver previously performed by the autonomous vehicle along the logged path includes simulating travel of the autonomous vehicle along the logged path from the logged start location to the logged end location.

9. The method of claim 8, wherein replaying the logged run of the particular maneuver previously performed by the autonomous vehicle along the logged path includes replaying logged other road agent behavior.

10. The method of claim 1, wherein performing the simulated run of the particular maneuver includes performing the simulated run of the particular maneuver using a simulated subset of systems of the autonomous vehicle.

11. A system comprising one or more processors configured to:

receive log data collected for a given area by sensors of an autonomous vehicle;

generate, from the log data, environment data for the given area, the environment data including one or more reconstructions of one or more objects detected in the given area;

identify, using the log data, a logged start location and a logged end location associated with a logged run of a particular maneuver previously performed by the autonomous vehicle along a logged path, wherein the identification of the logged start location and the logged end location further includes replaying the logged run of the particular maneuver previously performed by the autonomous vehicle along the logged path;

perform, using autonomous vehicle software, a simulated run of the particular maneuver by a simulated autonomous vehicle using the environment data generated from the log data, wherein the simulated run of the particular maneuver (i) includes one or more respective locations at which the autonomous vehicle software generates one or more driving decisions while the simulated autonomous vehicle performs the particular maneuver and (ii) does not include responses of road agents while the simulated autonomous vehicle performs the particular maneuver;

determine a simulated start location and a simulated end location associated with the simulated run of the particular maneuver;

determine whether the simulated start location differs from the logged start location;

determine whether the simulated end location differs from the logged end location; and evaluate the autonomous vehicle software based at least on:

whether the simulated start location is determined to differ from the logged start location; and whether the simulated end location is determined to differ from the logged end location.

12. The system of claim 11, wherein the given area includes a point at which the particular maneuver appears in the log data.

13. The system of claim 11, wherein the environment data includes reconstructions of real-world objects based on characteristics of the real-world objects.

14. The system of claim 11, wherein the one or more processors are further configured to select the given area based on feature criteria.

15. The system of claim 11, wherein the one or more processors are further configured to select the given area based on user input.

16. The system of claim 11, wherein the one or more processors are further configured to evaluate the autonomous vehicle software further based on at least one of compliance metrics, location metrics, scene impact metrics, overall quality metrics, and improvement cost metrics.

17. A non-transitory, tangible, computer-readable medium on which instructions are stored, the instructions, when executed by one or more processors, cause the one or more processors to implement a method, the method comprising:

receiving log data collected for a given area by sensors of an autonomous vehicle;

generating, from the log data, environment data for the given area, the environment data including one or more reconstructions of one or more objects detected in the given area;

identifying, using the log data, a logged start location and a logged end location associated with a logged run of a particular maneuver previously performed by the autonomous vehicle along a logged path, wherein identifying the logged start location and the logged end location further includes replaying the logged run of the particular maneuver previously performed by the autonomous vehicle along the logged path;

performing, using autonomous vehicle software, a simulated run of the particular maneuver by a simulated autonomous vehicle using the environment data generated from the log data, wherein the simulated run of the particular maneuver (i) includes one or more respective locations at which the autonomous vehicle software generates one or more driving decisions while the simulated autonomous vehicle performs the particular maneuver and (ii) does not include behavior of road agents while the simulated autonomous vehicle performs the particular maneuver;

determining a simulated start location and a simulated end location associated with the simulated run of the particular maneuver;

determining whether the simulated start location differs from the logged start location;

determining whether the simulated end location differs from the logged end location; and evaluating the autonomous vehicle software based at least on:

whether the simulated start location is determined to differ from the logged start location; and whether the simulated end location is determined to differ from the logged end location.

18. The medium of claim 17, wherein replaying the logged run of the particular maneuver previously performed by the autonomous vehicle along the logged path includes simulating travel of the autonomous vehicle along the logged path from the logged start location to the logged end location.

19. The medium of claim 18, wherein replaying the logged run of the particular maneuver previously performed by the autonomous vehicle along the logged path includes replaying logged other road agent behavior.

20. The medium of claim 18, wherein performing the simulated run of the particular maneuver includes performing the simulated run of the particular maneuver using a simulated subset of systems of the autonomous vehicle.

* * * * *